(12) United States Patent
Kraus et al.

(10) Patent No.: US 6,841,200 B2
(45) Date of Patent: Jan. 11, 2005

(54) DUAL WAFER LOAD LOCK

(75) Inventors: Joseph Arthur Kraus, Austin, TX (US); James David Strassner, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/391,494

(22) Filed: Mar. 17, 2003

(65) Prior Publication Data

US 2003/0167612 A1 Sep. 11, 2003

Related U.S. Application Data

(63) Continuation of application No. 09/906,887, filed on Jul. 16, 2001, now Pat. No. 6,558,509, which is a continuation-in-part of application No. 09/451,628, filed on Nov. 30, 1999.

(51) Int. Cl.[7] .................................................. C23C 4/04
(52) U.S. Cl. .................................................... 427/452
(58) Field of Search ..................... 118/723 R; 427/542, 427/452

(56) References Cited

U.S. PATENT DOCUMENTS

| 4,311,542 A | 1/1982 | Mueller et al. ............... 156/84 |
| 4,405,435 A | 9/1983 | Tateishi et al. ............. 204/298 |
| 4,498,416 A | 2/1985 | Bouchaib .................... 118/719 |
| 4,592,306 A | 6/1986 | Gallego ...................... 118/719 |
| 4,607,593 A | 8/1986 | Van Hemel .................. 118/719 |
| 4,664,062 A | 5/1987 | Kamohara et al. .......... 118/719 |
| 4,680,061 A | 7/1987 | Lamont, Jr. .................. 148/1.5 |
| 4,681,773 A | 7/1987 | Bean ............................ 427/38 |
| 4,687,542 A | 8/1987 | Davis et al. ................. 156/643 |
| 4,709,655 A | 12/1987 | Van Mastrigt ............... 118/719 |
| 4,715,921 A | 12/1987 | Maher et al. ................ 156/345 |
| 4,717,461 A | 1/1988 | Strahl et al. ............. 204/192.1 |
| 4,733,631 A | 3/1988 | Boyarsky et al. ........... 118/719 |
| 4,739,787 A | 4/1988 | Stoltenberg ................... 137/14 |

(List continued on next page.)

FOREIGN PATENT DOCUMENTS

| EP | 0 756 316 | 1/1997 | ........... H01L/21/00 |
| JP | 60-221572 | 3/1984 | ........... C23C/14/56 |
| JP | 61-170568 | 1/1985 | ............ B41M/5/26 |
| JP | 61-246381 | 4/1985 | ........... C23C/16/50 |
| JP | 62-116769 | 11/1985 | ........... C23C/16/44 |
| JP | 62-131455 | 12/1985 | ........... C23C/14/48 |
| JP | 62-164875 | 1/1986 | ........... C23C/14/56 |
| JP | 4-87782 | 3/1992 | ......... B25B/23/157 |
| JP | 4-87784 | 3/1992 | .............. B25J/5/00 |
| JP | 4-87785 | 3/1992 | |
| WO | 87/07309 | 12/1987 | ........... C23C/16/00 |
| WO | 99/03133 | 1/1999 | ........... H01L/21/00 |

OTHER PUBLICATIONS

European Search Report, European Application No. EP 02 25 4961, dated Dec. 18, 2003.

*Primary Examiner*—John F. Niebling
*Assistant Examiner*—Andre' Stevenson
(74) *Attorney, Agent, or Firm*—Moser, Patterson & Sheridan

(57) ABSTRACT

A method and apparatus for transferring a substrate between a first environment having a first pressure and a second environment having a vacuum pressure is provided. In one embodiment, the apparatus comprises a chamber body having a first port disposed in a first wall and a second port disposed in a second wall that seals the chamber from the first and second environments. A cooling plate, a first substrate holder and a second substrate holder are disposed within the chamber body. The cooling plate is disposed at the bottom of the chamber body. The first port and the second port are sequentially opened and the pressure within the load lock regulated to allow substrate to pass through the load lock. A window is disposed in the top of the chamber body that allows a metrology device to view the chamber volume.

7 Claims, 4 Drawing Sheets

U.S. PATENT DOCUMENTS

| | | | |
|---|---|---|---|
| 4,816,098 A | 3/1989 | Davis et al. | 156/345 |
| 4,820,106 A | 4/1989 | Walde et al. | 414/217 |
| 4,825,808 A | 5/1989 | Takahashi et al. | 118/719 |
| 4,852,516 A | 8/1989 | Rubin et al. | 118/715 |
| 4,857,160 A | 8/1989 | Landau et al. | 204/192.12 |
| 4,886,592 A | 12/1989 | Anderle et al. | 204/298 |
| 4,911,103 A | 3/1990 | Davis et al. | 118/725 |
| 4,917,556 A | 4/1990 | Stark et al. | 414/217 |
| 4,951,601 A | 8/1990 | Maydan et al. | 118/719 |
| 4,966,519 A | 10/1990 | Davis et al. | 414/786 |
| 5,000,113 A | 3/1991 | Wang et al. | 118/723 |
| 5,044,871 A | 9/1991 | Davis et al. | 414/786 |
| 5,067,218 A | 11/1991 | Williams | 29/25.01 |
| 5,088,444 A | 2/1992 | Ohmine et al. | 118/719 |
| 5,186,718 A | 2/1993 | Tepman et al. | 29/25.01 |
| 5,199,483 A | 4/1993 | Bahng | 165/1 |
| 5,226,632 A | 7/1993 | Tepman et al. | 251/335.3 |
| 5,259,881 A | 11/1993 | Edwards et al. | 118/719 |
| 5,352,248 A | 10/1994 | Ishikawa et al. | 29/25.01 |
| 5,362,526 A | 11/1994 | Wang et al. | |
| 5,380,682 A | 1/1995 | Edwards et al. | 437/225 |
| 5,444,207 A * | 8/1995 | Sekine et al. | 219/121.43 |
| 5,445,484 A | 8/1995 | Kato et al. | 414/217 |
| 5,455,082 A * | 10/1995 | Saito et al. | 427/542 |
| 5,516,732 A | 5/1996 | Flegal | 437/250 |
| 5,520,002 A | 5/1996 | Ishikawa | 62/55.5 |
| 5,582,866 A | 12/1996 | White | 427/248.1 |
| 5,586,585 A | 12/1996 | Bonora et al. | 141/93 |
| 5,620,578 A | 4/1997 | Hurwitt | 2024/298.25 |
| 5,665,968 A * | 9/1997 | Meisburger et al. | 250/310 |
| 5,769,952 A | 6/1998 | Komino | 118/733 |
| 5,784,238 A | 7/1998 | Nering et al. | 361/65 |
| 5,795,355 A | 8/1998 | Moran | 29/25.01 |
| 5,833,426 A | 11/1998 | Marohal | 414/217 |
| 5,855,681 A | 1/1999 | Maydan et al. | 118/719 |
| 5,873,942 A | 2/1999 | Park et al. | 118/719 |
| 5,884,009 A | 3/1999 | Okase | 392/418 |
| 5,900,105 A | 5/1999 | Toshima | 156/345 |
| 5,902,088 A | 5/1999 | Fairbairn et al. | 414/217 |
| 5,909,994 A | 6/1999 | Blum et al. | 414/217 |
| 5,930,456 A | 7/1999 | Vosen | 392/416 |
| 5,944,857 A | 8/1999 | Edwards et al. | 29/25.01 |
| 6,007,675 A | 12/1999 | Toshima | 156/345 |
| 6,017,395 A | 1/2000 | Matuno et al. | 118/715 |
| 6,039,770 A | 3/2000 | Yang et al. | 29/25.01 |
| 6,042,623 A | 3/2000 | Edwards | 29/25.01 |
| 6,044,534 A | 4/2000 | Seo et al. | 29/28.01 |
| 6,048,154 A | 4/2000 | Wytman | 414/217 |
| 6,083,321 A | 7/2000 | Lei et al. | 118/719 |
| 6,120,606 A | 9/2000 | Peng | 118/719 |
| 6,145,673 A | 11/2000 | Burrows et al. | 211/41.18 |
| 6,152,070 A | 11/2000 | Fairbairn et al. | 118/719 |
| 6,312,525 B1 | 11/2001 | Bright et al. | 118/719 |
| 6,383,402 B1 * | 5/2002 | Smith et al. | 216/60 |
| 6,419,801 B1 * | 7/2002 | Smith et al. | 204/192.13 |
| 6,450,116 B1 * | 9/2002 | Noble et al. | 118/723 R |
| 6,471,464 B1 * | 10/2002 | Fay et al. | 414/783 |

* cited by examiner

DUAL WAFER LOAD LOCK

CROSS-REFERENCE TO RELATED APPLICATIONS

This application is a continuation of U.S. patent application Ser. No. 09/906,887, filed Jul. 16, 2001, now U.S. Pat. No. 6,558,509 which is a continuation-in-part of copending U.S. patent application Ser. No. 09/451,628, filed Nov. 30, 1999. Each of the aforementioned related patent applications is herein incorporated by reference.

BACKGROUND OF THE DISCLOSURE

1. Field of Invention

The embodiments of the invention generally relate to a method and apparatus for transferring substrates in a semiconductor processing system.

2. Background of Invention

Semiconductor substrate processing is typically performed by subjecting a substrate to a plurality of sequential processes to create devices, conductors and insulators on the substrate. These processes are generally performed in a process chamber configured to perform a single step of the production process. In order to efficiently complete the entire sequence of processing steps, a number of process chambers are typically coupled to a central transfer chamber that houses a robot to facilitate transfer of the substrate between the surrounding process chambers. A semiconductor processing platform having this configuration is generally known as a cluster tool, examples of which are the families of PRODUCER®, CENTURA® and ENDURA® processing platforms available from Applied Materials, Inc., of Santa Clara, Calif.

Generally, a cluster tool consists of a central transfer chamber having a robot disposed therein. The transfer chamber is generally surrounded by one or more process chambers. The process chambers are generally utilized to sequentially process the substrate, for example, by performing various processing steps such as etching, physical vapor deposition, chemical vapor deposition, ion implantation, lithography and the like. As the processes performed in the process chambers are generally performed at vacuum pressure, the transfer chamber is maintained at vacuum pressure as well to eliminate having to repeatedly pump down the process chamber for each substrate transfer. This is partially important as pumping down the transfer chamber may require as much as eight hours to reach operational vacuum levels.

Load lock chambers are generally used to facilitate transfer of the substrates between the vacuum environment of the transfer chamber and an environment of a factory interface wherein substrates are stored in cassettes. The factory interface is typically at or near atmospheric pressure. The load lock chambers are selectively isolated from the factory interface and transfer chamber by slit valves. Generally, at least one slit valve is maintained in a closed position to prevent loss of vacuum in the transfer chamber during substrate transfer through the load lock. For example, an interface slit valve is opened while a chamber slit valve is closed to allow an interface robot to transfer substrates between the load lock chamber and the substrate storage cassettes disposed in the factory interface. After the substrate is loaded from the interface robot, both slit valves are closed as the load lock chamber is evacuated by a pump to a vacuum level substantially equal to that of the transfer chamber. The substrate in the evacuated load lock is passed into the transfer chamber by opening the chamber slit valve while the interface slit valve remains closed. Processed substrates are returned to the factory interface in the reverse manner, wherein the load lock chamber is vented to substantially equalize the pressure between the load lock chamber and the factory interface.

There are generally two types of load lock chambers utilized to interface with the transfer chamber. A first type is known as a batch-type load lock chamber. The batch-type chamber generally holds an entire substrate storage cassette within the chamber. The cassette is loaded into the load lock chamber and the chamber is sealed and pumped down to an appropriate vacuum level. The chamber is then opened to the transfer chamber so that the robot within the transfer chamber may freely access any of the substrates and storage slots within the cassette until all of the substrates within the cassette have been processed. After all the substrates have been returned to the cassette, the load lock chamber is isolated from the transfer chamber to facilitate replacing the cassette with another cassette containing substrates to be processed. While the cassettes are being exchanged, the transfer robot typically draws substrates from a cassette disposed in a second load lock chamber coupled to the transfer chamber.

The use of batch-type load lock chambers is generally a robust and effective system for transferring substrates into the transfer chamber. However, due to the relatively large internal volume required to accommodate the entire substrate cassette, pump-down times are long and the associated pumping hardware is large and costly. Additionally, venting of the large internal volume increases the chance of particulate contamination and condensation on the substrates.

The second type of load lock chamber is known as a single substrate-type. Generally, the single substrate-type load lock chamber shuttles one processed and one unprocessed substrate therethrough each time the load lock chamber is pumped down. To maintain high system throughput, single substrate-type load lock chambers are typically used in tandem. This allows a first load lock chamber to exchange substrates with the transfer chamber while a second load lock chamber exchanges substrates with the factory interface wherein the substrate storage cassettes are positioned.

Cluster tools often utilize more than one load lock to maintain high substrate transfer rates between the factory interface and the transfer chamber. However, the second load lock occupies a position on the transfer chamber at the expense of an additional process chamber throughput and process versatility is sacrificed. Thus, if one of the load lock chambers could be eliminated without loss of substrate exchange rates between the transfer chamber and factory interface, an additional process chamber could be utilized in the open facet of the transfer chamber, thus enhancing system throughput and versatility. Moreover, utilizing a single load lock chamber would advantageously reduce the cost of ownership for the system.

Therefore, there is a need for an improved load lock chamber.

SUMMARY OF INVENTION

In one aspect, the invention generally provides an apparatus for transferring a substrate between a first environment having a first pressure and a second environment having a vacuum pressure. In one embodiment, the apparatus comprises a chamber body having a first side wall, a second side wall, a top and a bottom defining a chamber volume therebetween. A first port is disposed in the first wall and selectively seals the chamber volume from the first environment. A second port is disposed in the second wall and selectively seals the chamber volume from the second environment. A temperature control pedestal, a first substrate holder and a second substrate holder are disposed between the top and the bottom of the chamber body. The second substrate holder is disposed between the top of the chamber body and the first substrate holder. The temperature control pedestal is disposed between the bottom of the chamber body and the first substrate holder. The first port and the second port are sequentially opened and the pressure within the load lock regulated to allow substrates to pass through the load lock chamber. A window is disposed in the top of the chamber body that allows a metrology device to view the chamber volume.

In another aspect, a method for transferring semiconductor substrates between a first environment having a first pressure and a second environment having a vacuum pressure using a single load lock chamber is provided. In one embodiment, the method includes transferring a processed substrate from the second environment to a second substrate holder disposed in the chamber, moving a cooling plate to contact the processed substrate, venting the chamber, and removing the processed substrate into the first environment.

BRIEF DESCRIPTION OF DRAWINGS

The teachings of the present invention can readily be understood by considering the following detailed description in conjunction with the accompanying drawings in which.

To facilitate understanding, identical reference numerals have been used, wherever possible, to designate identical elements that are common to the figures.

DETAILED DESCRIPTION OF INVENTION

Figure 1:
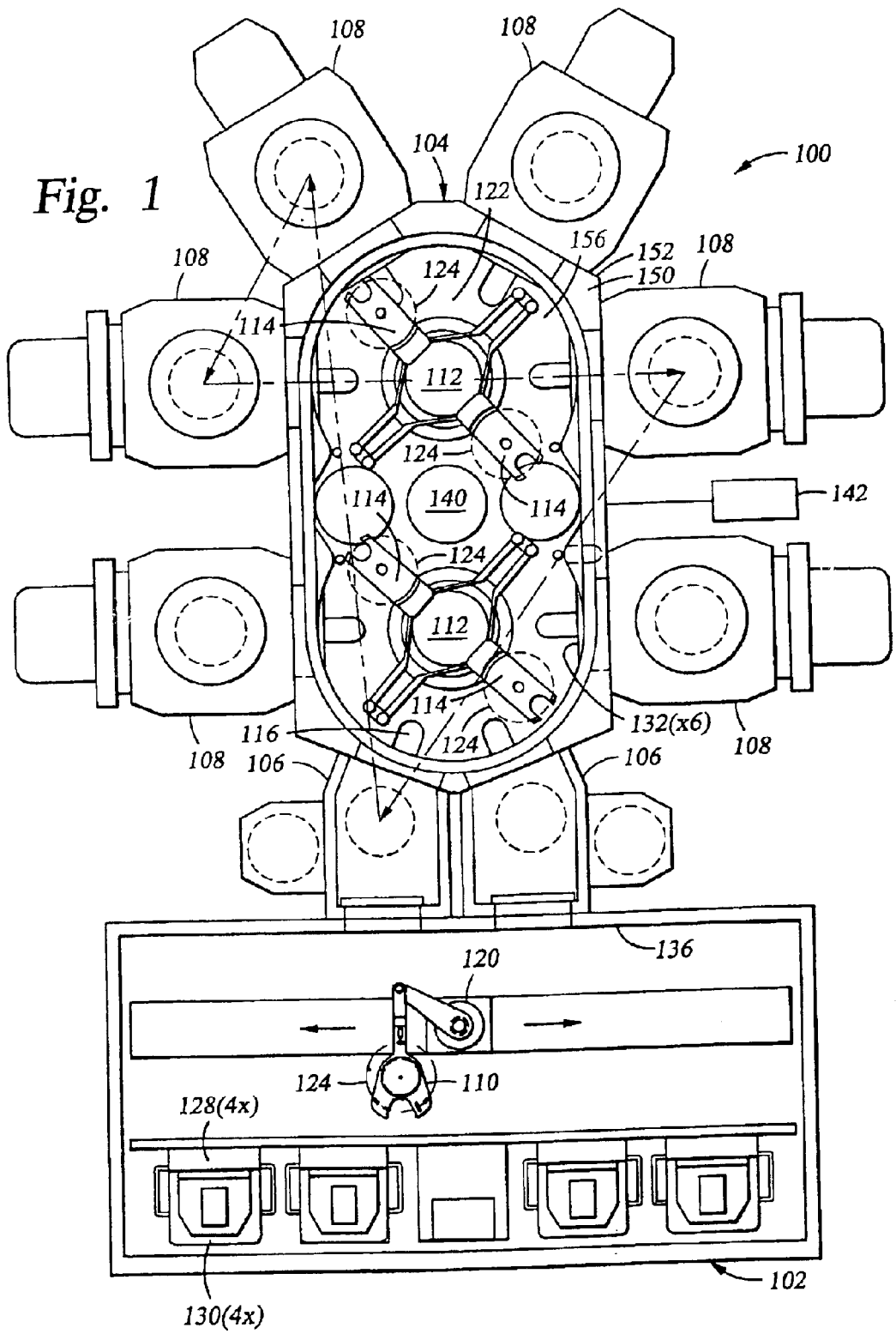
FIG. 1 depicts a plan view of a substrate processing system that includes one embodiment of a load lock chamber of the invention.

FIG. 1 depicts a processing system 100 that generally includes a factory interface 102, one or more load lock chambers 106, a plurality of process chambers 108 and a substrate transfer chamber 104. The transfer chamber 104 is generally used to transfer substrates 124 between a vacuum environment maintained in the transfer chamber 104 and a substantially ambient environment maintained in the factory interface 102. One example of a processing system that may be adapted to benefit from the invention is an ENDURA SL® processing platform, available from Applied Materials, Inc., of Santa Clara, Calif. Although the load lock chamber 106 is described in reference to the exemplary processing system 100 depicted in FIG. 1, the load lock chamber 106 has utility in other systems or wherever transfer of substrates between vacuum and ambient environments is desired.

The factory interface 102 generally includes an interface robot 120 and a plurality of bays 128. Each bay 128 is adapted to receive a substrate storage cassette 130. Generally, the factory interface 102 is coupled to the load lock chamber 106 through a side wall 136 that is positioned opposite the bays 128. The interface robot 120 is disposed in an interior volume 116 of the factory interface 102 that is maintained at a substantially ambient pressure. The interface robot 120 includes at least a first gripper 110 coupled thereto. Generally, the first gripper 110 may be an edge gripper, vacuum gripper or other substrate securing device used to hold the substrate 124 during transfer. The interface robot 120 is generally positioned between the side wall 136 and bays 128 to facilitate transfer of substrates between the cassettes 130 and the load lock 106. An example of one factory interface that may be adapted to benefit from the invention is described in U.S. patent application Ser. No. 09/161,970, filed Sep. 28, 1998 by Kroeker, which is hereby incorporated by reference in its entirety.

The transfer chamber 104 is generally fabricated from a single piece of material such as aluminum. The transfer chamber 104 generally includes side walls 150 and chamber bottom 156. A lid 138 (shown in FIG. 2) is supported by the side walls 150 and, with the side wall 150 and chamber bottom 156, define an evacuable interior volume 122 therebetween. Substrates 124 are transferred between the process chambers 108 and load lock chambers 106 coupled to the exterior of the chamber 104 through the vacuum maintained within the volume 122.

At least one transfer robot 112 is disposed in the transfer chamber 104 to facilitate transfer of substrates between the process chambers 108. The transfer robot 112 has at least one end effector such as a gripper or a blade 114 for securing the substrate during transfer. The transfer robot 112 typically has a "frog-leg" linkage that is commonly used to transfer substrates in vacuum environments. The transfer robot 112 is generally disposed in the interior volume 122 of the transfer chamber 104 and has a range of motion that allows the substrate 124 to be transferred between the load lock 106 and the process chambers 108. In one embodiment, the transfer chamber 104 includes two transfer robots 112 each having dual blades 114.

The process chambers 108 are typically fastened to an exterior side 152 of the side walls 150 of the transfer chamber 104. Examples of process chambers 108 that may be utilized are etching chambers, physical vapor deposition chambers, chemical vapor deposition chambers, ion implantation chambers, lithography chambers and the like. Different process chambers 108 may be coupled to the transfer chamber 104 to provide a processing sequence necessary to form a predefined structure or feature upon the substrate's surface. An aperture (not shown) is disposed in the side wall between each process chamber 108 (or other chambers) to allow the substrate to be passed between the process chamber 108 and interior volume 122 of the transfer chamber 104. A slit valve 132 selectively seals each aperture to maintain isolation between the environments of the chambers 108, 104 between substrate transfers and during processing within the process chambers 108. One slit valve that may be used to advantage is described in U.S. Pat. No. 5,226,632, issued Jul. 13, 1993 to Tepman, et al., which is hereby incorporated by reference in its entirety.

Generally, a pumping system 142 is coupled to the transfer chamber 104 to evacuate and maintain the chamber at a predetermined vacuum level. Typically, a pumping port 140 is centrally disposed in the chamber bottom 156 to fluidly couple the interior volume 122 to the pumping system 142. The pumping system 142 may include one or more pumps such as a roughing pump, a turbomolecular pump or a cryogenic pump.

The load lock chamber 106 is generally coupled between the factory interface 102 and the transfer chamber 104. The load lock chamber 106 is generally used to facilitate transfer of the substrates 124 between a vacuum environment which is maintained in the interior volume 122 of the transfer chamber 104 and an environment of the factory interface 102 rapidly without loss of vacuum within the transfer chamber.

Figure 2:
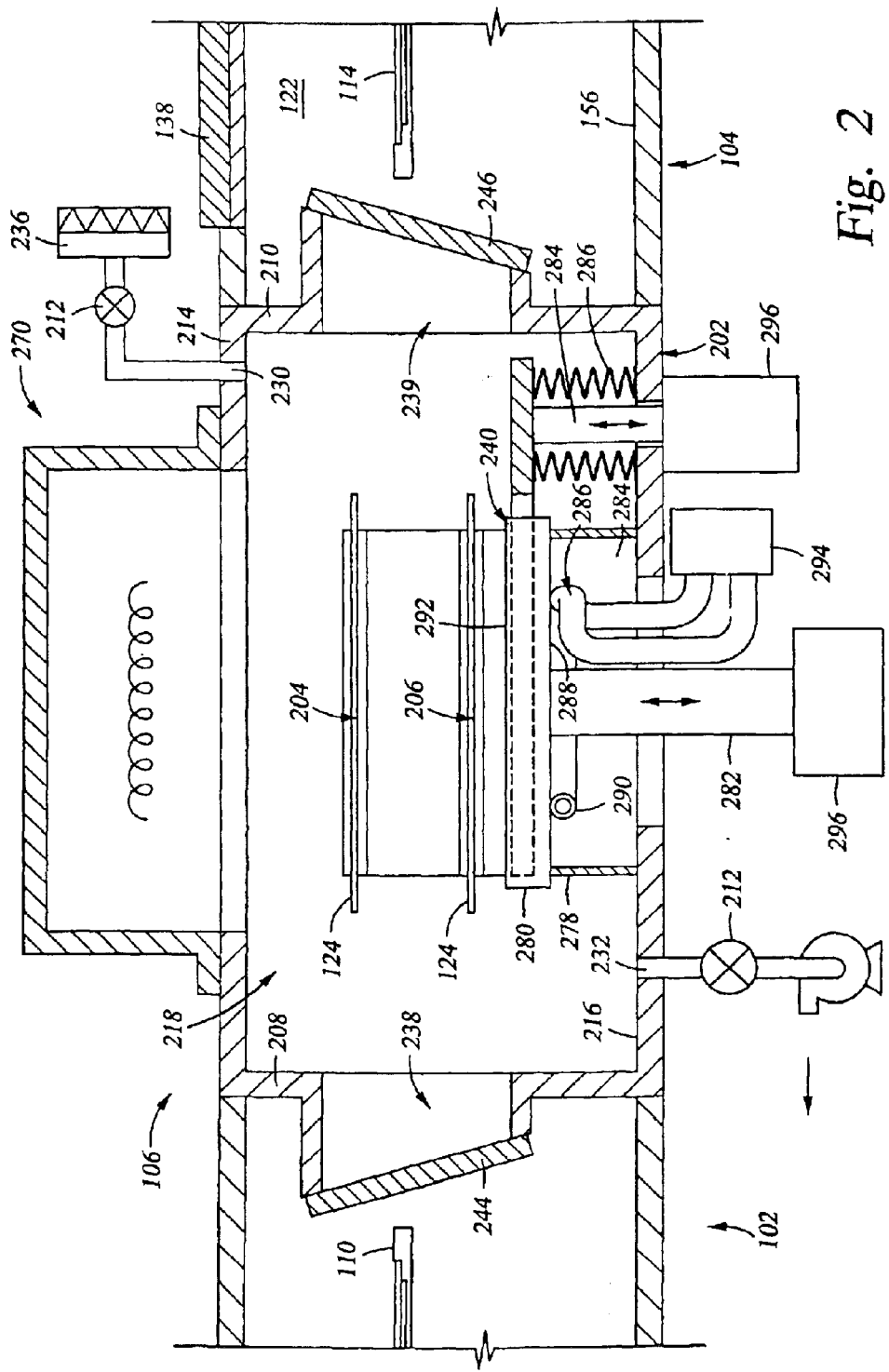
FIG. 2 depicts a sectional view of the load lock chamber of FIG. 1.

FIG. 2 depicts one embodiment of the load lock chamber 106. The load lock chamber 106 generally comprises a chamber body 202, a first substrate holder 204, a second substrate holder 206, a temperature control pedestal 240 and a heater module 270. The chamber body 202 is preferably fabricated from a singular body of material such as aluminum. The chamber body 202 includes a first side wall 208, a second side wall 210, lateral walls (242 in FIG. 3), a top 214 and a bottom 216 that define a chamber volume 218. A window 250, typically comprised of quartz, is disposed in the top 216 of the chamber body 202 and is at least partially covered by the heater module 270.

The atmosphere of the chamber volume 218 is controlled so that it may be evacuated to substantially match the environment of the transfer chamber 104 and be vented to substantially match the environment of the factory interface 102. Generally, the chamber body 202 includes a vent passage 230 and a pump passage 232. Typically, the vent passage 230 and the pump passage 232 are positioned at opposite ends of the chamber body 202 to induce laminar flow within the chamber volume 218 during venting and evacuation to minimize particulate contamination. In one embodiment, the vent passage 230 is disposed through the top 214 of the chamber body 202 while the pump passage 232 is disposed through the bottom 216 of the chamber body 202. The passages 230, 232 typically are coupled to a valve 212 to selectively allow flow into and out of the chamber volume 218. Alternatively, the passages 230, 232 may be positioned at opposite ends of one of the chamber walls, or on opposing or adjacent walls.

In one embodiment, the vent passage 230 is coupled to a high efficiency air filter 234 such as available from Camfil-Farr, of Riverdale, N.J. The pump passage 232 is coupled to a point-of-use pump 236 such as available from Alcatel, headquartered in Paris, France. The point-of-use pump 236 has low vibration generation to minimize the disturbance of the substrates 124 positioned within the load lock chamber 106 while promoting pump-down efficiency and time by minimizing the fluid path between the chamber 106 and pump 234 to generally less than three feet.

A first loading port 238 is disposed in the first wall 208 of the chamber body 202 to allow substrates 124 to be transferred between the load lock 106 and the factory interface 102. A first slit valve 244 selectively seals the first loading port 238 to isolate the load lock 106 from the factory interface 102. A second loading port 239 is disposed in the second wall 210 of the chamber body 202 to allow substrates 124 to be transferred between the load lock 106 and the transfer chamber 104. A second slit valve 146 which is substantially similar to the first slit valve 244 selectively seals the second loading port 239 to isolate the load lock 106 from the vacuum environment of the transfer chamber 104. One slit valve that may be used to advantage is described in U.S. Pat. No. 5,226,632, issued Jul. 13, 1993 to Tepman et al., which is hereby incorporated by reference in its entirety.

Generally, the first substrate holder 204 is concentrically coupled to (i.e., stacked on top of) the second substrate holder 206 that is disposed above the chamber bottom 216. The substrate holders 204 and 206 are generally mounted to a hoop 220 that is coupled to a shaft 284 that extends through the bottom 216 of the chamber body 202. Typically, each substrate holder 204, 206 is configured to retain one substrate. The shaft 284 is coupled to a lift mechanism 294 that controls the elevation of the substrate holders 204 and 206 within the chamber body 206. A bellows 284 is generally disposed around the shaft 284 to prevent leakage from or into the body 206.

Typically, the first substrate holder 204 is utilized to hold an unprocessed substrate while the second substrate holder 206 is utilized to hold a processed substrate returning from the transfer chamber 104. The flow within the load lock 106 during venting and evacuation is substantially laminar due to the position of the vent passage 230 and pump passage 232 and is configured to minimize particulate contamination.

Figure 3:
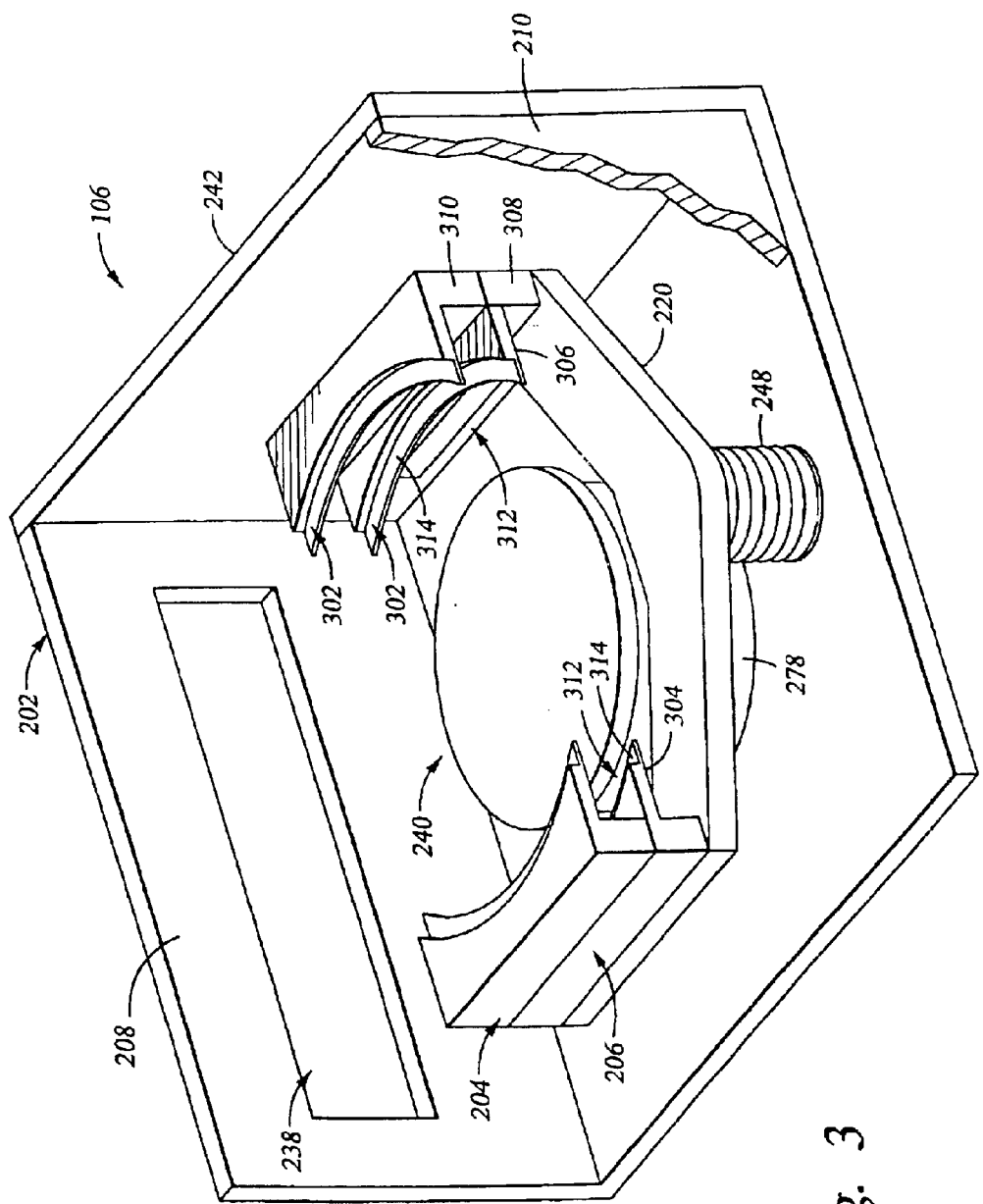
FIG. 3 depicts a sectional view of one embodiment of a heater module.

FIG. 3 depicts one embodiment of the substrate holders 204, 206. The second substrate holder 206 is generally held above the bottom 216 of the chamber body 202 by the hoop 220. A first standoff 308 is disposed between each member 304, 306 to maintain the second substrate holder 206 in a spaced-apart relation to the hoop 220. A second standoff 310 is disposed between the first and second substrate holders 204, 206 to maintain a spaced-apart relation therebetween. Generally, the standoffs 308, 310 allow grippers 110, 114 of the transfer and factory interface robots 112, 120 to pass therebetween when retrieving and depositing substrates on the substrate holders 204, 206.

Generally, each substrate holder 204, 206 includes a first member 304 and a second member 306. Each holder 204, 206 may have alternatively include a "L-shaped" configuration that incorporates a portion that maintains a spaced-apart relation between holder 204, 206 and adjacent components of the load lock 106.

Each member 304, 306 includes a curved inner portion 312 that has a lip 314 extending radially inwards therefrom. The curved inner portion 312 is generally configured to allow the substrate 124 to pass therebetween and rest on the lip 314. The curved inner portion 312 captures the substrate 124 therebetween, thus preventing the substrate 124 from falling off the lip 314.

Referring back to FIG. 2, the temperature control pedestal 240 is typically coupled to the bottom 216 of the chamber body 202 by a support 278. The support 278 may be hollow or include passages therethrough to allow fluids, electrical signals, sensor and the like to be coupled to the pedestal 240. Alternatively, the pedestal 240 may be movably coupled to the chamber body 202.

The temperature control pedestal 240 generally includes a platen 280 which is generally fabricated from a thermally conductive material such as aluminum or stainless steel but may alternatively be comprised of other materials such as ceramic. The platen 280 generally has a heat transfer element 286 such as fluid passage disposed in the platen 280 or disposed in contact with a lower surface 288 of the platen 280. Alternatively, the heat transfer element 286 may be a circulated water jacket, a thermoelectric device such as a Peltier device or other structure that may be utilized to control the temperature of the platen 280.

In one embodiment, the heat transfer element 286 comprises a tube 290 disposed proximate the lower surface 288 of the platen 280. The tube 290 is coupled to a fluid source 294 that circulates a fluid through the tube. The fluid, for example facility water from the fluid source 294, may optionally be thermally regulated. The tube 290 may be disposed in a substantially circular or spiral pattern against the lower surface 288 of the platen 280. Typically, the tube 290 is brazed to the lower surface 288 or adhered using a conductive adhesive. Optionally, a conductive plate (not shown) such as a copper plate may alternatively be disposed between the tube 290 and platen 280 to promote uniformity of heat transfer across the width of the platen 280.

The hoop 220 having the substrate holders 204, 206 coupled thereto may be lowered to a first position where an upper surface 292 of the platen 280 is in close proximity or in contact with the substrate supported by the second substrate holder 206. In the first position, the platen 280 may be used to regulate the temperature of the substrate disposed on (or proximate to) the platen 280. For example, a substrate returning from processing may be cooled in the load lock chamber 106 by supporting the substrate during the evacuation of the chamber 106 on the upper surface 292 of the platen 280. Thermal energy is transferred from the substrate through the platen 280 to the heat transfer element 286, thereby cooling the substrate. After cooling the substrate, the substrate holders 204, 206 may be raised towards the top 214 of the chamber body 202 to allow the robots 112, 120 access to the substrate seated in the second substrate support 206. Alternatively, the substrate may be heated. Optionally, the holders 204, 206 may be lowered to a position where the upper surface 292 is in contact or close proximity to the substrate supported by the first substrate holder 204. In this position, the platen 280 may be used to thermally regulate the substrate.

The shaft 282 generally couples the substrate holders 204, 206 to a lift mechanism 296 disposed exterior to the load lock chamber 106. The bellows 284 are coupled between the second substrate holder 206 and the bottom 216 of the chamber body 202 and provide a flexible seal therebetween, thus facilitating raising and lowering the substrate holders 204, 206 without compromising the pressure within the load lock chamber 106.

Figure 4:
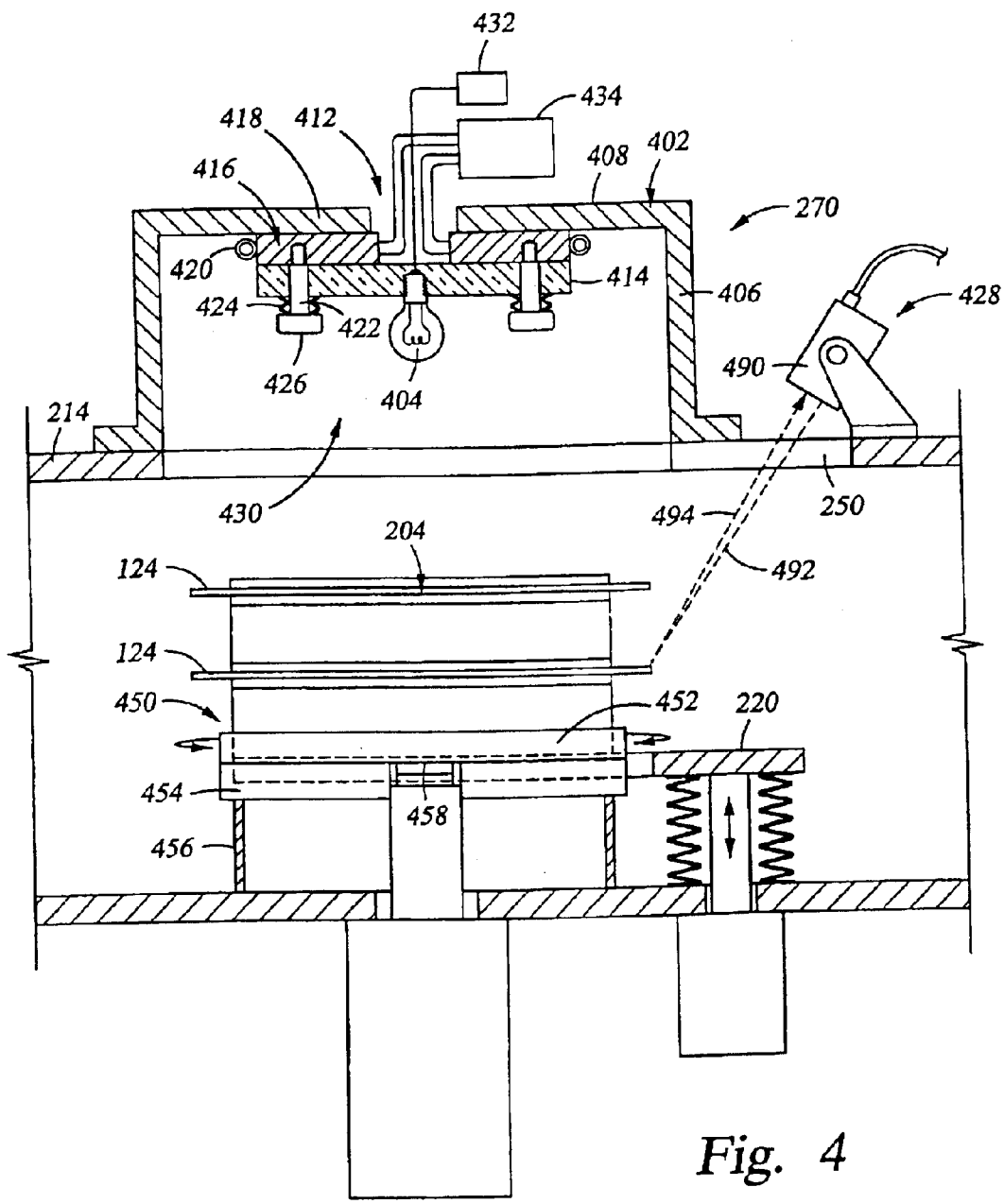
FIG. 4 depicts a sectional view of another embodiment of a load lock chamber.

FIG. 4 depicts a sectional view of one embodiment of the heater module 270. The heater module 270 is generally disposed on the top 214 of the load lock chamber 106. The heater module 270 may alternatively comprise various types of radiant heaters. In one embodiment, the heater module 270 includes a housing 402 having a lamp 404 disposed therein. The housing 402 generally includes sides 406 and a top 408 that define an interior 430. The sides 406 are generally coupled to the top of the chamber body. An aperture 412 is disposed in the top 408 of the heater module 270 to facilitate power connection to the lamp 402. The lamp 402 is generally coupled to a power source 432 by a ceramic socket 414.

A cooling device 416 is coupled to the socket 414 to control the temperature rise of the lamp 402 to extend the life of the lamp 402. In one embodiment, the cooling device 416 is an annular plate 418 having good thermal conductivity that is thermally regulated by a circulating fluid. In one embodiment, the annular plate 418 is a copper disk having a tube 420 brazed to the perimeter of the plate 418. The fluid is circulated through the tube 420 from a fluid source 434 thereby regulating the temperature of the plate 418. Alternatively, the cooling device 416 may include thermoelectric devices, heat sinks, water jackets and other devices that limit the temperature rise of the socket 414.

The socket 414 is typically biased against the plate 418 to promote heat transfer therebetween. In one embodiment, a shoulder screw 422 is disposed through the socket 414 and plate 418 and threads into the top 408 of the housing 402. To accommodate thermal expansion between the socket 414 and plate 418, one or more springs 424 are disposed between a head 426 of the shoulder screw 422 and the socket 414.

The spring 424, which may be a coil, flat, belliville or other basising device, maintains contact between the socket 414 and plate 418 over a wide range of temperature without damaging the socket 414.

FIG. 4 additionally depicts another embodiment of a temperature control pedestal 450. The temperature control pedestal 450 is substantially similar to the temperature control pedestal 240 described with reference to FIG. 2 except that the temperature control pedestal 450 rotates. In one embodiment, the pedestal 450 generally includes an upper portion 452 and a lower portion 454. The lower portion is generally stationary and is coupled a bottom 456 of the chamber. A rotary actuator 458 is disposed between the upper portion 452 and lower portion 454 of the pedestal 450. The rotary actuator 458 generally provides rotary motion to the upper portion 452 of the pedestal 450. When the second substrate holder 206 is lowered to dispose the substrate 124 on the upper portion 452, the upper portion 452 rotates the substrate 124. The rotary actuator 458 may be a solenoid, air motor, electric motor or other device that induces rotary motion to the upper portion 452 of the pedestal 450. Alternatively, the rotary actuator 458 may be disposed remote to the load lock chamber and configured to rotate the upper portion 452 of the pedestal 450 via a linkage (not shown) disposed through the bottom 456.

A metrology device 428 is disposed proximate the window. The metrology device 428 may be a wafer type sensor, a wafer orientation sensor, a wafer center sensor, a wafer location sensor, a film thickness detector, a topography detector or other device utilized to detect attributes of the substrate disposed in the load lock chamber. Generally, the metrology device 428 is disposed proximate the heater module 270 and positioned to view the substrate through the window. Alternatively, the metrology device 428 may be disposed in the heater module 270.

In one embodiment, the metrology device 428 includes a sensor 490 disposed outside of the chamber 106 and positioned to view the substrate supported on the pedestal 450 through the window 250 disposed in the top 214 of the chamber body 202. As the pedestal 450 rotates the substrate, the sensor 490 projects a beam 492 to the perimeter of the substrate 124. The orientation of the substrate is determined by detecting variations in a portion 494 of beam 492 reflected off the substrate due to features such as notches or flats (not shown) in the perimeter of the substrate.

Referring primarily to FIG. 2, in operation, the load lock 106 generally facilitates the transfer of substrates between the ambient atmosphere of the factory interface and the vacuum atmosphere of the transfer chamber. The load lock 106 temporarily houses the substrate while the atmosphere within the load lock 106 is adjusted to match the atmosphere of the chamber into which the substrate is to be transferred.

For example, the slit valve 244 is opened while the load lock 106 is vented to substantially atmospheric pressure to match the atmosphere of the factory interface 102. The factory interface robot 120 transfers an unprocessed substrate from one of the cassettes 130 to the first substrate holder 204. A processed substrate is removed from the second substrate holder 206 by the factory interface robot 120 and returned to one of the cassettes 130. After completion of the substrate transfer, the slit valve 244 and vent passage 230 are closed. The pump passage 232 is opened and the load lock chamber 106 is pumped down to the pressure substantially equal to the pressure of the transfer chamber 104. During pump down, the heater module 270 heats the substrate residing in the first substrate holder 204.

The metrology device 428 (seen in FIG. 4) may be utilized to determine the substrate's center or other substrate metric.

Once the pressures within the load lock 106 and transfer chamber 104 are substantially equal, the slit valve 246 is opened. A processed substrate is positioned in the second substrate holder 206 by the transfer robot 112. The transfer robot 112 then retrieves the unprocessed substrate for position in the first substrate holder 204 for processing in one or more of the process chambers 108 circumscribing the transfer chamber 104. After substrate transfer is completed, the second slit valve 246 is closed to seal the load lock 106 from the transfer chamber 104.

The vent passage 230 is opened in the load lock 106 to allow the pressure in the load lock 106 to rise to substantially match the pressure in the factory interface 102. While venting, the pedestal 242 is raised to contact the substrate disposed in the second substrate holder 206. The substrate is cooled by transferring heat through the pedestal 240 to the fluid circulating in the tube 290. The metrology device 428 may be utilized to detect a metric of the substrate, for example, surface defects. Once, the pressures are matched, the first slit valve 244 is opened to allow the factory interface robot 120 to access the load lock 106 as described above.

Although the teachings of the present invention that have been shown and described in detail herein, those skilled in the art can readily devise other varied embodiments that still incorporate the teachings and do not depart from the scope and spirit of the invention.

What is claimed is:

1. A method for transferring semiconductor substrates between a first environment having a first pressure and a second environment in a vacuum chamber having a vacuum pressure using a single load lock chamber, the method comprising:

transferring a single substrate from the first environment to a first substrate holder in the load lock chamber while the load lock chamber is open to the first environment;

determining a metric of the substrate by viewing the substrate through a window disposed in a top of the load lock chamber;

evacuating the load lock chamber; and removing the substrate into the second environment.

2. A method for transferring semiconductor substrates between a first environment having a first pressure and a second environment having a vacuum pressure using a single load lock chamber, the method comprising:

transferring a substrate to a first substrate holder;

determining a metric of the substrate by viewing the substrate through a window disposed in a top of the chamber;

evacuating the chamber; and removing the substrate into the second environment, wherein the determining the metric of the substrate further comprises:
        moving a cooling plate to contact the substrate;
        rotating the cooling plate and substrate; and
        determining an orientation or center of the substrate.

3. The method of claim 1, wherein the substrate disposed on the first substrate holder is an unprocessed substrate.

4. The method of claim 3 further comprising:

transferring a processed substrate from the second environment to a second substrate holder disposed in the load lock chamber;

moving a cooling plate to contact the processed substrate;

venting the load lock chamber; and removing the processed substrate into the first environment.

5. The method of claim 3 further comprising:

heating the unprocessed substrate disposed on the first substrate holder.

6. A method for transferring semiconductor substrates between a first environment in a factory interface having a first pressure and a second environment in a vacuum chamber having a vacuum pressure using a single load lock chamber, the method comprising:

transferring a processed substrate from the second environment to a first substrate holder disposed in the load lock chamber;

moving a cooling plate to contact the processed substrate disposed on the first substrate holder;

venting the load lock chamber;

removing the processed substrate into the first environment;

transferring an unprocessed substrate from the first environment to a second substrate holder above the first substrate holder;

heating the unprocessed substrate disposed on the second substrate holder;

evacuating the load lock chamber;

determining a metric of the processed and/or unprocessed substrate while the respective substrate is disposed in the load lock chamber; and then removing the unprocessed substrate into the second environment.

7. A method for transferring semiconductor substrates between a first environment having a first pressure and a second environment having a vacuum pressure using a single load lock chamber, the method comprising:

transferring a processed substrate from the second environment to a first substrate holder disposed in the chamber;

moving a cooling plate to contact the processed substrate disposed on the first substrate holder;

venting the chamber;

removing the processed substrate into the first environment;

transferring an unprocessed substrate from the first environment to a second substrate holder above the first substrate holder;

heating the unprocessed substrate disposed on the second substrate holder;

evacuating the chamber;

removing the unprocessed substrate into the second environment; and determining a metric of the processed and/or unprocessed substrate, wherein the step of determining the metric of the unprocessed substrate further comprises:
        moving the cooling plate to contact the unprocessed substrate;
        rotating the cooling plate and unprocessed substrate; and
        determining an orientation or center of the unprocessed substrate.

* * * * *